United States Patent
Ross et al.

(10) Patent No.: US 6,582,777 B1
(45) Date of Patent: Jun. 24, 2003

(54) ELECTRON BEAM MODIFICATION OF CVD DEPOSITED LOW DIELECTRIC CONSTANT MATERIALS

(75) Inventors: Matthew Ross, La Jolla, CA (US); Heike Thompson, San Diego, CA (US); Jingjun Yang, Cary, NC (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/506,515

(22) Filed: Feb. 17, 2000

(51) Int. Cl.[7] .............................. B05D 3/06; C23C 16/32
(52) U.S. Cl. .................... 427/551; 427/552; 427/249.1; 427/255.29
(58) Field of Search .................. 427/249.7, 255.28, 427/551, 552, 249.1, 255.29

(56) References Cited

U.S. PATENT DOCUMENTS

| | | |
|---|---|---|
| 4,713,258 A | 12/1987 | Umemura |
| 4,983,540 A | 1/1991 | Yamaguchi et al. |
| 5,003,178 A | 3/1991 | Livesay |
| 5,609,925 A | 3/1997 | Camilletti et al. |
| 6,057,251 A | 5/2000 | Goo et al. |
| 6,235,353 B1 * | 5/2001 | Drage et al. ................. 427/493 |

FOREIGN PATENT DOCUMENTS

| | | |
|---|---|---|
| JP | 60-43814 | 3/1985 |
| JP | WO 97/00535 | 1/1997 |
| JP | 11121451 * | 4/1999 |
| WO | WO 96/36070 | 11/1996 |
| WO | WO 99/43025 * | 8/1999 |

OTHER PUBLICATIONS

Patent Abstracts of Japan, Pub. No. 11121451, Pub. Date Apr. 30, 1999, Samsung Electron Co., Ltd.

* cited by examiner

*Primary Examiner*—Bret Chen
(74) *Attorney, Agent, or Firm*—Roberts & Mercanti LLP

(57) ABSTRACT

A process for forming low dielectric constant dielectric films for the production of microelectronic devices. A dielectric layer is formed on a substrate by chemical vapor depositing a monomeric or oligomeric dielectric precursor in a chemical vapor deposit apparatus, or a reaction product formed from the precursor in the apparatus, onto a substrate, to form a layer on a surface of a substrate. After optionally heating the layer at a sufficient time and temperature to dry the layer, the layer is then exposed to electron beam radiation, for a sufficient time, temperature, electron beam energy and electron beam dose to modify the layer. The electron beam exposing step is conducted by overall exposing the dielectric layer with a wide, large beam of electron beam radiation from a large-area electron beam source.

31 Claims, No Drawings

ELECTRON BEAM MODIFICATION OF CVD DEPOSITED LOW DIELECTRIC CONSTANT MATERIALS

BACKGROUND OF THE INVENTION

1. Field of the Invention

The invention pertains to dielectric films, more particularly the invention concerns the reduction of the dielectric constant of chemical vapor deposited (CVD) films which are useful for the production of microelectronic devices.

2. Description of the Related Art

The semiconductor industry is rapidly decreasing the dimensions and increasing the density of circuitry and electronic components in microelectronic devices, silicon chips and integrated circuits. In addition, integrated circuits are being layered or stacked with ever decreasing insulating layer thickness between each circuitry layer.

In the production of advanced integrated circuits that have minimum feature sizes of 0.25 micrometers and below, problems of interconnect RC delay, power consumption and crosstalk become significant. With these decreasing geometries and device sizes, the semiconductor industry has sought to avoid parasitic capacitance and crosstalk noise caused by inadequate insulating layers in the integrated circuits. One way to achieve the desired low RC delay and higher performance in integrated circuit devices involves the use of dielectric materials in the insulating layers which have a low dielectric constant. The use of low dielectric constant (k) materials for interlevel dielectric and intermetal dielectric applications partially mitigates these problems. Low dielectric constant (low-k) materials reduce the capacitance of the circuit interconnect materials. The device speed is limited in part by the RC delay which is determined by the resistance of the metal used in the interconnect scheme, and the dielectric constant of the insulating dielectric material used between the metal interconnects. Until now, the materials which are contemplated by the industry for having dielectric constants significantly lower than the currently employed dense silica, suffer from disadvantages. Most low dielectric constant material developments use spin-on-glasses and fluorinated plasma chemical vapor deposition $SiO_2$ with k greater than 3. Some spin-on-glasses have k lower than 3.

The formation of low-k materials for use in interconnect applications can be achieved by either chemical vapor deposition (CVD) or spin on techniques. It is generally accepted that most materials applied to a substrate via CVD or spin coating techniques require a thermal cure process to achieve the desired film properties. Chemically vapor deposited materials such as silicon oxides are frequently used as an insulator or as a gate material on silicon-based integrated circuits, protective coatings, gate insulators for field effect transistors, passivation or inter-metal layers for elemental and compound semiconductor devices, and capacitor dielectrics for memory devices.

The need for a thermal cure, or annealing process, for CVD deposited materials depends on the composition and deposition process of the particular material. The deposition process parameter that is critical for film properties is usually the deposition temperature, or the substrate temperature during deposition. For materials that are deposited at low temperatures, there is a need in some cases for a thermal cure process to achieve the desired film properties. As the required value for the dielectric constant is decreased due to device performance demands, there are competing types of low-k materials, e.g., porous materials, that can be both organic and inorganic, and organic compositions that might include inorganic components. The need for an additional processing step for these types of materials is dependent on several variables. For the porous materials there is a need to insure that the mechanical and physical properties are acceptable (i.e. stress, planarization etc.), especially for damascene processing. For the organic materials, there is a need to insure that the thermal and mechanical properties are sufficient for either subtractive processing or damascene processing. The disadvantage of using a thermal process to achieve the desired film properties of CVD deposited films is that it adds an additional process step, which includes possibly an additional process tool. There is a trend to reduce the total thermal budget of the interconnection process flow. This includes both peak process temperature and total process time at temperature. Thus, most integrated circuit manufacturers would like to reduce the number of thermal process steps as well as the peak process temperature used in the required process steps. Previous approaches to depositing such films have included plasma enhanced chemical vapor deposition (PECVD), electron cyclotron resonance plasma chemical vapor deposition, low pressure chemical vapor deposition (LPCVD) and atmospheric pressure chemical vapor deposition (APCVD), sub-atmospheric chemical vapor deposition (SACVD) or high density plasma chemical vapor deposition (HDP-CVD) using Si precursors.

The reduction of the dielectric constant of the film must maintain the physical properties of the films, while improving their electrical properties, such as reducing failures due to early dielectric breakdowns, enhancing performance as an insulator, and reducing the presence of unwanted electrical charges within the material lattice. Previous attempts to reduce the dielectric constant of CVD films required very long heating times. For example, the dielectric constant of fluorine doped $SiO_2$ has been reduced by thermally processing the material at 400° C. in Nitrogen for at least 60 minutes. There is an accompanying film shrinkage with this treatment. It has now been found that by applying an electron beam to the CVD deposited material, a reduction in both peak process temperature and total process time may be achieved. The application of the electron beam to the CVD material may induce radical formation and a modification of the material such that the desired film properties can be achieved. It has been unexpectedly found that the dielectric constant of the CVD deposited materials may be reduced by the electron beam process to a value below that attainable by conventional thermal processing. The electron beam is applied at an energy sufficient to treat the entire thickness of the CVD material. The total dose applied would be determined by the desired film properties necessary for the implementation of the specific CVD low-k material. The electron beam process would be carried out at a temperature necessary to achieve the desired properties in the CVD low-k material. Because of the diverse nature of the current CVD low-k materials, and the potential development of future CVD low-k materials, the electron beam process conditions will depend on the particular material under consideration. Thus, a dielectric constant of 3.0 or below can be achieved depending on the composition of the film. This would provide a cost advantage to device manufacturers because they can extend their existing oxide CVD equipment with minimal cost.

The present invention applies an electron beam treatment to the CVD film to reduce the dielectric constant of the film. Because the electrons can penetrate the entire thickness of the film, they can modify the properties through the bulk of the film. The electron beam also modifies oxide films which leads to a more stable film.

SUMMARY OF THE INVENTION

The invention provides a process for forming a dielectric layer on a substrate which comprises chemical vapor depositing a monomeric or oligomeric dielectric precursor in a chemical vapor deposition apparatus, or a reaction product formed from the precursor in the apparatus, onto a substrate, to thus form a layer on a surface of a substrate; optionally heating the layer at a sufficient time and temperature to dry the layer; and then exposing the layer to electron beam radiation, for a sufficient time, temperature, electron beam energy and electron beam dose modify the layer.

The invention also provides a process for reducing the dielectric constant of a chemical vapor deposited dielectric layer on a substrate which comprises exposing the chemical vapor deposited dielectric layer to electron beam radiation, for a sufficient time, temperature, electron beam energy and electron beam dose to modify the layer.

The invention further provides a process for producing a dielectric layer on a substrate which comprises, positioning a substrate within a chemical vapor deposition apparatus; charging a monomeric or oligomeric dielectric precursor suitable for chemical vapor into the chemical vapor deposition apparatus; depositing the precursor, or a reaction product formed from the precursor in the apparatus, as a layer onto a surface of a substrate, optionally heating the layer at a sufficient time and temperature to dry the layer; and then exposing the layer to electron beam radiation, for a sufficient time, temperature, electron beam energy and electron beam dose to modify the layer.

The invention still further provides a process for producing a microelectronic device which comprises positioning a substrate within a chemical vapor deposit apparatus; charging a monomeric or oligomeric dielectric precursor suitable for chemical vapor into the chemical vapor deposition apparatus; depositing the precursor, or a reaction product formed from the precursor in the apparatus, as a layer onto a surface of a substrate, optionally heating the layer at a sufficient time and temperature to dry the layer; and then exposing the layer to electron beam radiation, for a sufficient time, temperature, electron beam energy and electron beam dose to modify the layer.

The invention also provides a microelectronic device formed by a process which comprises positioning a substrate within a chemical vapor deposition apparatus; charging a monomeric or oligomeric dielectric precursor suitable for chemical vapor into the chemical vapor deposition apparatus; depositing the precursor, or a reaction product formed from the precursor in the apparatus, as a layer onto a surface of a substrate, optionally heating the layer at a sufficient time and temperature to dry the layer; and then exposing the layer to electron beam radiation, for a sufficient time, temperature, electron beam energy and electron beam dose to modify the layer.

The invention also provides a process for forming a dielectric layer on a substrate which comprises chemical vapor depositing a dielectric layer on a substrate and then exposing the chemical vapor deposited dielectric layer to electron beam radiation for a sufficient time, temperature, electron beam energy and electron beam dose to reduce the dielectric constant of the layer.

DETAILED DESCRIPTION OF THE PREFERRED EMBODIMENT

As a first step in the process of the invention, a chemical vapor depositable monomer or oligomer material is deposited onto a substrate by any CVD means known in the art.

Typical substrates are those suitable to be processed into an integrated circuit or other microelectronic device. Suitable substrates for the present invention non-exclusively include semiconductor materials such as gallium arsenide (GaAs), germanium, lithium niobate, silicon and compositions containing silicon such as silicon germanium, crystalline silicon, polysilicon, amorphous silicon, epitaxial silicon, and silicon dioxide ($SiO_2$) and mixtures thereof.

On the surface of the substrate is an optional pattern of raised lines, such as metal, oxide, nitride or oxynitride lines which are formed by well known lithographic techniques. Suitable materials for the lines include silica, silicon nitride, titanium nitride, tantalum nitride, aluminum, aluminum alloys, copper, copper alloys, tantalum, tungsten and silicon oxynitride. These lines form the conductors or insulators of an integrated circuit. Such are typically closely separated from one another at distances of about 20 micrometers or less, preferably 1 micrometer or less, and more preferably from about 0.05 to about 1 micrometer.

The chemical vapor deposited dielectric is monomeric or oligomeric, or the reaction product of the monomer or oligomer which is formed in the CVD reactor. Useful chemical vapor depositable monomers and oligomers non-exclusively include an oxide, nitride, oxynitride, fluorinated oxide such as fluorinated $SiO_2$, diamond-like carbon, fluorinated diamond-like carbon, alkyl silanes, alkoxysilanes, Si—O—C, N-terminated arylene ethers, $F_4$-terminated arylene ethers, amorphous C—F, Si—C and combinations thereof. Specific materials nonexclusively include silicon nitride, titanium nitride, tantalum nitride, tantalum oxynitride, tungsten oxynitride, silicon oxynitride and blends thereof. Such materials are well known in the art and are either commercially available or may be produced by techniques known in the generally available literature.

Useful alkoxysilanes for this invention include those which have the formula:

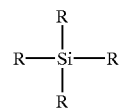

wherein at least 2 of the R groups are independently $C_1$ to $C_4$ alkoxy groups and the balance, if any, are independently selected from the group consisting of hydrogen, alkyl, phenyl, halogen, substituted phenyl. For purposes of this invention, the term alkoxy includes any other organic group which can be readily cleaved from silicon at temperatures near room temperature by hydrolysis. R groups can be ethylene glycoxy or propylene glycoxy or the like, but preferably all four R groups are methoxy, ethoxy, propoxy or butoxy. The most preferred alkoxysilanes nonexclusively include tetraethoxysilane (TEOS) and tetramethoxysilane.

The dielectric precursor may be deposited in a pure or neat state (not mixed with any solvents) or it may be present in a solution where it is mixed with solvents. Preferably the dielectric polymer is dispersed in a suitable compatible solvent and injected into the CVD chamber and deposited onto a substrate. Suitable solvents nonexclusively include methanol, ethanol, n-propanol, isopropanol, n-butanol; aprotic solvents such as cyclic ketones including cyclopentanone, cyclohexanone and cyclooctanone; cyclic amides such as N-alkylpyrrolidinone wherein the alkyl group has from 1 to about 4 carbon atoms, and N-cylohexyl-pyrrolidinone, and mixtures thereof Other relatively high volatility solvent compositions which are compatible with the other ingredients can be readily determined by those skilled in the art. When solvents are present, the polymer is preferably present in an amount of from about 1% to about 50% by weight of the polymer, more preferably from about 3% to about 20%. The solvent component is preferably present in an amount of from about 50% to about 99% by weight of the dielectric composition, more preferably from about 80% to about 97%.

The layer is applied to the substrate via chemical vapor deposition such as by low pressure chemical vapor deposition (LPCVD), plasma-enhanced chemical vapor deposition (PECVD), atmospheric pressure chemical vapor deposition (APCVD), sub-atmospheric chemical vapor deposition (SACVD) or high density plasma chemical vapor deposition (HDP-CVD). Such techniques are well known in the art. The thickness of the layer on the substrate may vary depending on the deposition procedure and parameter setup, but typically the thickness may range from about 100 Å to about 50,000 Å, and preferably from about 500 Å to about 20,000 Å and most preferably from about 1,000 Å to about 10,000 Å.

One method of fluorinated silicon oxide film deposition is taught in U.S. Pat. No. 5,876,798 where films of fluorinated silicon oxide are deposited by means of CVD at reduced pressure using fluorotriethoxysilane (FTES) and tetraethoxysilane (TEOS) as the precursors, together with ozone (mixed with oxygen). Other methods of forming such layers are taught in U.S. Pat. Nos. 5,807,785 and 5,660,895 and 5,492,736.

Film deposition may be conducted with a commercially available CVD apparatus. Chemical vapor deposition processes are well known to those skilled in the art and chemical vapor deposition reactors are widely commercially available. One suitable reactor is model SK-23-6-93 commercially available from Vactronic Equipment Labs of Bohemia, N.Y. Others may be obtained from ASM International, Novellus Systems, or Applied Materials. A useful plasma enhanced chemical vapor deposition (PECVD) apparatus is a Plasma Therm model VII-70 PECVD system or a Vactronic Model PECVD-2000-M.9. The chemical vapor depositing is conducted by heating at a relatively low temperature of from about 100° C. to about 500° C., preferably from about 200° C. to about 400° C. and more preferably from about 350° C. to about 400° C. The heating during the deposition is conducted at a relatively short time of from about 30 seconds to about 3 minutes, until a dried film is obtained. The film is composed of a deposited material which is either monomeric, oligomeric or an intermediate reaction product of an monomeric or oligomeric material which is formed within the CVD reaction chamber. However, it is preferred not to deposit polymers, but rather the electron beam treatment causes a modification, i.e. a curing, polymerization, crosslinking or annealing of the deposited monomer, oligomer or intermediate reaction product. The dynamics of the CVD deposition process are very different from a spin-on material deposition process. In the case of the spin-on deposition process, the material is coated onto the wafer in its final, or close to final form. An optional heating step may be done to the material to remove moisture, solvent, and other unwanted volatile compounds. The optional heating may be done at a relatively low temperature of from about 100° C. to about 500° C., preferably from about 200° C. to about 400° C. and more preferably from about 350° C. to about 400° C. for a relatively short time of from about 30 seconds to about 3 minutes, until a dried film is obtained.

There may be some level of crosslinking during the heating, but for the most part the material is in its final molecular weight form. In a CVD deposition process, the precursor constituents of the final material are injected into the process chamber in some basic form. In the case of silicon dioxide, TEOS and ozone are injected into the process chamber where a plasma is formed to promote the process. In the plasma the TEOS is broken down and Si combines with O to form Si—O or Si—O2. These products then deposit onto the substrate where they bind with other Si—O or Si—$O_2$ molecules to form an extended silicon dioxide film. Thus, in the CVD deposition process the precursors are injected into a process chamber. These precursors are then broken down in the plasma which is generated in the process chamber. The appropriate components combine in the plasma and deposit on the wafer.

The film is then treated by exposing it to a flux of electrons to modify, i.e. cure, polymerize, crosslink or anneal the layer. Such a treatment is performed by placing the coated substrate inside the chamber of a large area electron beam exposure system, such as that described in U.S. Pat. No. 5,003,178 to Livesay, the disclosure of which is incorporated herein by reference. The exposing is conducted by overall flood exposing substantially the entire thickness of substantially the whole area of the layer to electron beam radiation all at once. The period of electron beam exposure will be dependent on the total dosage applied, the electron beam energy applied to the film and the beam current density. One of ordinary skill in the art can readily optimize the conditions of exposure. Preferably the electron beam exposure is done in vacuum in the range of from about $10^{-5}$ to about $10^2$ Torr, and with a substrate temperature in the range of from about 10° C. to about 400° C., more preferably from about 30° C. to about 400° C. and most preferably from about 200° C. to about 400° C. The exposure energy will fall into the range of from about 0.1 to about 100 keV, preferably from about 0.5 to about 20 keV and more preferably from about 1 to about 8 keV. The electron beam exposing is preferably conducted from a source which generates an electron beam current of from about 1 to about 100 mA more preferably, from about 1.0 mA to about 30 mA. The electron beam dose will fall into the range of from about 1 to about 100,000 $\mu C/cm^2$, preferably from about 100 to about 10,000 $\mu C/cm^2$. The dose and energy selected will be proportional to the thickness of the film to be processed. The appropriate doses and energies may easily be determined by those skilled in the art for the case at hand. Generally the exposure will range from about 0.5 minute to about 10 minutes, and preferably from about 2 minutes to about 4 minutes. The film coated substrate may be exposed to electron beams in any chamber having a means for providing electron beam radiation to substrates placed therein. The film is preferably subjected to an electron beam radiation from a uniform large-area electron beam source under conditions sufficient to stabilize the full width and full thickness of the film. Preferably the exposure is conducted with an electron beam which covers an area of from about 4 square inches to about 256 square inches. The gaseous ambient in the electron beam system chamber may be nitrogen, oxygen, hydrogen, argon, xenon, helium, ammonia, methane, silane, a blend of hydrogen and nitrogen, ammonia and mixtures thereof. Suitable equipment for electron beam exposure includes an Electron-Cure™ model 1200 or 400 which is commercially available from Honeywell International Inc. of San Diego, Calif. After electron beam exposing, the dielectric preferably has a dielectric constant of about 3.0 or less.

Preferably the overall process of chemical vapor deposition and electron beam surface treatment is conducted within a cluster tool having a chemical vapor deposition chamber, an electron beam irradiation chamber, and means for transferring the substrate from the chemical vapor deposition chamber to the electron beam irradiation chamber. The treatment in the chemical vapor deposition chamber, electron beam irradiation chamber and the transferring from the chemical vapor deposition chamber to the electron beam irradiation chamber are conducted while continuosly maintaining vacuum conditions. Such a cluster tool is described in commonly assigned U.S. patent application Ser. No. 09/272,869, filed Mar. 19, 1999 which is incorporated herein by reference. Wafers are continuously maintained in an isolated environment at a constant vacuum pressure level, and transferred into and out of an external atmospheric pressure environment through one or more access ports or load-locks. In a typical system, a cassette or carrier with a series of wafers is placed at an interface port of the cluster tool and latches release the port door. A manipulator robot picks up the cassette or individual wafer and directs them to desired processing stations within the equipment. After processing, the reverse operation takes place. Such a wafer processing technique essentially eliminates contaminates since treatment takes place after the wafers are sealed in the internal vacuum environment, and they are not removed prior to completion of processing. The configuration achieves a significant improvement over the conventional handling of open cassettes inside a clean room. In addition, since the vacuum is not broken from step to step, the use of cluster tools increases process productivity and reduces defect levels. The use of a cluster tool significantly aids semiconductor processing throughput. As a result chemical vapor deposition and electron beam treatment can be done directly within a cluster tool without breaking vacuum or removal of the substrate from the cluster tool.

In a process flow for the fabrication of an integrated circuit the following steps are carried out. A metal film, or layer stack of metal films, is deposited on a substrate. The metal film stack is patterned using standard photolithographic and etch process steps. The dielectric material used to insulate the metal interconnects is deposited by CVD. The dielectric film is processed using a large area electron beam source, such that the entire surface of the substrate is irradiated simultaneously. The substrate may be heated to the necessary temperature, with a process gas present in the electron beam chamber to achieve the plasma to maintain the electron beam and also to aid in the modification of the dielectric material. For subtractive processing, the dielectric material may be capped with an $SiO_2$ layer for chemical mechanical polishing (CMP) to achieve global planarization. For copper damascene processing the dielectric material may be coated with a hard mask material to act as an etch stop or CMP polish stop. In subtractive aluminum processing vias would be patterned in the dielectric material using standard photolithographic and etch processes. The vias would then be filled with a metal to connect between metal interconnect levels. In aluminum and copper damascene processing both vias and trenches would be patterned into the dielectric using standard photolithographic and etch processes. The vias and trenches would be filled with a barrier layer and conductor metal. The metal would be removed by CMP processing. The next level of metal interconnect would be formed using the above sequence of steps. The processes would be repeated to achieve the necessary number of metal interconnect levels.

The following non-limiting examples serve to illustrate the invention.

EXAMPLE 1

Deposition of fluorinated silicon dioxide film onto a silicon substrate is carried out in a PECVD reactor, while maintaining heating at between 345° C. and 400° C., a total pressure between 780 and 1000 mTorr and supplying between 73 to 100 watts of power to the plasma generating system. Electron beam exposure is then conducted in an ElectronCure™ 1200 chamber incorporating a large area electron source and quartz lamps for heating the wafer. The cold-cathode source produces a large area electron beam (over 200 mm in diameter) having a substantially uniform emission over its entire surface. Electron emission is controlled by the low bias voltage applied to the anode grid. Electron beam exposure was conducted at a temperature of 350° C. and in an argon atmosphere (10–30 milliTorr). The dose is 5,000 $\mu C/cm^2$. The electron beam current is 30 mA. The energy is 20 keV. After removal from the tool, the dielectric layer has a dielectric constant of less than 3.

EXAMPLE 2

A 4" silicon wafer is inserted into a cluster tool having interconnected CVD and electron beam exposure modules. A vacuum is applied through the entire tool including the electron beam exposure module. The wafer is transported into the CVD chamber and silane is allowed to flow into the CVD chamber. A dielectric film is deposited onto the wafer. The film thickness after the deposition process is approximately 5000 Å. Without breaking vacuum, the wafer is transported to the electron beam exposure module where it is exposed to electron beam radiation using a large area electron source while being heated by quartz lamps from below. The cold-cathode source produces a large area electron beam (over 200 mm in diameter) having a substantially uniform emission over its entire surface. Electron emission is controlled by the low bias voltage applied to the anode grid. Electron beam exposure was conducted at a temperature of 200° C. and in an argon atmosphere (10–30 milliTorr).

EXAMPLE 3

A thin film of Black Diamond™ inorganic F-doped $SiO_2$, from Applied Materials, is formed on a 4" silicon wafer using a HDP CVD. Deposition is conducted while heating at a temperature of 300° C. for three minutes. The film thickness after the deposition is approximately 5000 Å. Electron beam exposure is conducted in an ElectronCure™ 1200 chamber incorporating a large area electron source and quartz lamps for heating the wafer. The cold-cathode source produces a large area electron beam (over 200 mm in diameter) having a substantially uniform emission over its entire surface. Electron emission is controlled by the low bias voltage applied to the anode grid.

Electron beam exposure is conducted at a temperature of 400° C. for three minutes in an argon atmosphere (10–30 milliTorr). The dose is 3000 $\mu\mu\}C/cm^2$. The electron beam current is 20 mA. The energy is 5 keV. The layer has a dielectric constant of less than 3 and lower than a comparable layer which has been cured in a standard thermal cure without electron beam exposure.

EXAMPLE 4

A thin film of a tetraethoxysilane is formed on a 4" silicon wafer by CVD. Deposition is conducted while heating at a temperature of 300° C. for three minutes. The film thickness after the deposition is approximately 5000 Å. Electron beam exposure is conducted in an ElectronCure™ 1200 chamber incorporating a large area electron source and quartz lamps for heating the wafer. The cold-cathode source produces a large area electron beam (over 200 mm in diameter) having a substantially uniform emission over its entire surface. Electron emission is controlled by the low bias voltage applied to the anode grid. Electron beam exposure is conducted at a temperature of 400° C. for three minutes in an argon atmosphere (10–30 milliTorr). The dose is 5000 $\mu C/cm^2$. The electron beam current is 30 mA. The energy is 20 keV. The layer has a dielectric constant of less than 3.

EXAMPLE 5

A 4" silicon wafer inserted into a cluster tool having an interconnected chemical vapor deposition module and an electron beam exposure module. A vacuum is applied through the entire tool including the electron beam exposure module, the chemical vapor deposition module and a transport zone between the modules. The wafer is transported to the chemical vapor deposition module where the surface of the wafer is applied with a layer of silicon nitride by chemical vapor deposition. Without breaking the vacuum, the treated wafer is transported to the electron beam exposure module where it is exposed to electron beam radiation using a large area electron source while being heated. The cold-cathode source produces a large area electron beam (over 200 mm in diameter) having a substantially uniform emission over its entire surface. Electron emission is controlled by the low bias voltage applied to the anode grid. Electron beam exposure was conducted at a temperature of 350° C. and in an argon atmosphere (10–30 milliTorr). The dose is 10,000 $\mu C/cm^2$. The electron beam current is 30 mA. The energy is 20 keV. After removal from the tool, the silicon nitride layer has a dielectric constant of less than 3.

EXAMPLE 6

Comparative

A 4" silicon wafer is positioned in a CVD chamber. An nitrogen terminated arylene ether monomer is brought to the point of injection of the CVD process chamber. At the point of injection, the monomer is vaporized and its flow is metered into the process chamber. In the process chamber the monomers combine to form low molecular weight intermediates which are deposited onto the surface of the wafer. The molecular weight in the plasma is dependent on the residence time in the plasma and the crosslinking rate in the plasma. Once the low molecular weight materials deposit onto the wafer, the can cross-link only with other polymers locally. In this case only within the range of bond formation. In order to achieve a higher molecular weight polymer on the substrate, the film is heated to a temperature of 400° C. for 60 minutes to cross-link the film. The dielectric constant of the film is 2.9.

EXAMPLE 7

A 4" silicon wafer is positioned in a CVD chamber. Liquid, nitrogen terminated arylene ether monomer is brought to the point of injection of the CVD process chamber. At the point of injection, the monomer is vaporized and its flow is metered into the process chamber. In the process chamber the monomers combine to form low molecular weight intermediates which are deposited onto the surface of the wafer. The molecular weight in the plasma is dependent on the residence time in the plasma and the crosslinking rate in the plasma. The film is heated to a temperature of 350° C. for 2 minutes to form a dry film but not high enough to substantially activate the crosslinking mechanism. At this point the as-deposited material would not be suitable for use due to its low level of crosslinking.

After deposition the film is irradiated with an electron beam in place of a thermal cure process. The electron beam is applied at an energy sufficient to penetrate the entire thickness of the film. The film is exposed to sufficient dose to cross-link the deposited material extensively. An electron beam dose of 1000 $\mu C/cm^2$ is applied at a temperature of 300° C. for three minutes. After irradiation the material is crosslinked such that its molecular weight is increased and its properties dielectric improved. The dielectric constant of the film is lowered to 2.6 after electron beam processing.

While the present invention has been particularly shown and described with reference to preferred embodiments, it will be readily appreciated by those of ordinary skill in the art that various changes and modifications may be made without departing from the spirit and scope of the invention. It is intended that the claims be to interpreted to cover the disclosed embodiment, those alternatives which have been discussed above and all equivalents thereto.

What is claimed is:

1. A process for forming a dielectric layer on a substrate which comprises chemical vapor depositing a monomeric or oligomeric dielectric which is a dielectric precursor in a chemical vapor deposition apparatus, or chemical vapor depositing a reaction product formed from the precursor in the apparatus, onto a substrate, to thus form a layer on a surface of a substrate, wherein the chemical vapor deposited dielectric is selected from the group consisting of Si—O—C materials, Si—C materials and combinations thereof; optionally heating the layer at a sufficient time and temperature to dry the layer; and then exposing the layer to electron beam radiation, for a sufficient time, temperature, electron beam energy and electron beam dose to modify the layer.

2. The process of claim 1 wherein the heating step is conducted.

3. The process of claim 1 wherein the substrate comprises a semiconductor material.

4. The process of claim 1 wherein the substrate comprises a material selected from the group consisting of gallium arsenide, germanium, silicon, silicon germanium, lithium niobate, crystalline silicon, polysilicon, amorphous silicon, epitaxial silicon, silicon dioxide and mixtures thereof.

5. The process of claim 1 wherein the substrate has a pattern of lines on its surface wherein the lines comprise a metal, an oxide, a nitride or an oxynitride.

6. The process of claim 1 wherein the substrate has a pattern of lines on its surface wherein the lines comprise a material selected from the group consisting of silica, silicon nitride, titanium nitride, tantalum nitride, aluminum, aluminum alloys, copper, copper alloys, tantalum, tungsten and silicon oxynitride.

7. The process of claim 1 wherein the chemical vapor depositing is conducted at a temperature of from about 100° C. to about 500° C.

8. The process of claim 1 wherein the chemical vapor depositing is conducted at a temperature of from about 350° C. to about 400° C.

9. The process of claim 1 wherein the chemical vapor depositing is conducted by heating for from about 30 seconds to about 3 minutes.

10. The process of claim 1 wherein the exposing to electron beam radiation is conducted while at a temperature of from about 200° C. to about 400° C.

11. The process of claim 1 wherein the exposing to electron beam radiation is conducted for from about 2 minutes to about 4 minutes.

12. The process of claim 1 wherein the chemical vapor depositing is conducted at a temperature of from about 350°

C. to about 400° C. for from about 30 seconds to about 3 minutes, and wherein the exposing to electron beam radiation is conducted at a temperature of from about 200° C. to about 400° C. for from about 2 minutes to about 4 minutes.

13. The process of claim 1 wherein after electron beam exposing, the dielectric has a dielectric constant of about 3.0 or less.

14. The process of claim 1 wherein the chemical vapor depositing is conducted by low pressure chemical vapor deposition, plasma-enhanced chemical vapor deposition, atmospheric pressure chemical vapor deposition, sub-atmospheric chemical vapor deposition or high density plasma chemical vapor deposition.

15. The process of claim 1 wherein the exposing is conducted by overall flood exposing substantially the entire thickness of substantially the whole area of the layer to electron beam radiation.

16. The process of claim 1 wherein the electron beam exposing step is conducted at an energy level ranging from about 0.5 to about 20 keV.

17. The process of claim 1 wherein the electron beam exposing is from a source which generates an electron dose ranging from about 10 to about 100,000 $\mu C/cm^2$.

18. The process of claim 1 wherein the electron beam exposing is conducted from a source which generates an electron beam current of from about 1 to about 30 mA.

19. The process of claim 1 wherein the electron beam exposing is conducted while heating the substrate to a temperature of from about 10° C. to about 400° C.

20. The process of claim 1 wherein the electron beam exposing is conducted while the substrate is under a pressure maintained in the range of from about $10^{-5}$ to about $10^2$ Torr.

21. The process of claim 1 wherein the electron beam exposing is conducted in a gas selected from the group consisting of nitrogen, oxygen, hydrogen, argon, xenon, helium, ammonia, methane, silane, ammonia and mixtures thereof.

22. The process of claim 1 wherein the electron beam exposing step is conducted by overall exposing the layer with a wide, large beam of electron beam radiation from a large-area electron beam source.

23. The process of claim 1 wherein the electron beam exposing step is conducted by overall exposing the layer with a wide, large beam of electron beam radiation from a uniform large-area electron beam source which covers an area of from about 4 square inches to about 256 square inches.

24. A process for reducing the dielectric constant of a chemical vapor deposited dielectric layer selected from the group consisting of Si—O—C materials, Si—C materials and combinations thereof, on a substrate which comprises exposing the chemical vapor deposited dielectric layer to electron beam radiation, for a sufficient time, temperature, electron beam energy and electron beam dose to modify the layer.

25. The process of claim 24 wherein the chemical vapor deposited dielectric is monomeric or oligomeric.

26. A process for producing a dielectric layer on a substrate which comprises, positioning a substrate within a chemical vapor deposition apparatus; charging a monomeric or oligomeric dielectric which is a dielectric precursor suitable for chemical vapor deposition into the chemical vapor deposition apparatus; depositing the precursor, or depositing a reaction product formed from the precursor in the apparatus, as a layer onto a surface of a substrate, optionally heating the layer at a sufficient time and temperature to dry the layer; and then exposing the layer to electron beam radiation, for a sufficient time, temperature, electron beam energy and electron beam dose to modify the layer, wherein the layer is selected from the group consisting of Si—O—C materials, Si—C materials and combinations thereof.

27. A process for producing a microelectronic device which comprises positioning a substrate within a chemical vapor deposition apparatus; charging a monomeric or oligomeric dielectric which is a dielectric precursor suitable for chemical vapor deposition into the chemical vapor deposition apparatus; depositing the precursor, or depositing a reaction product formed from the precursor in the apparatus, as a layer onto a surface of a substrate, optionally heating the layer at a sufficient time and temperature to dry the layer; and then exposing the layer to electron beam radiation, for a sufficient time, temperature, electron beam energy and electron beam dose to modify the layer, wherein the layer is selected from the group consisting of Si—O—C materials, Si—C materials and combinations thereof.

28. The process of claim 27 wherein the substrate comprises a semiconductor material and the substrate has a pattern of metallic lines on the surface.

29. A process for forming a dielectric layer on a substrate which comprises chemical vapor depositing a monomeric or oligomeric dielectric precursor in a chemical vapor deposition apparatus, or a reaction product formed from the precursor in the apparatus, onto a substrate, to thus form a layer on a surface of a substrate; and then exposing the layer to electron beam radiation, for a sufficient time, temperature, electron beam energy and electron beam dose to modify the layer, wherein the layer is selected from the group consisting of Si—O—C materials, Si—C materials and combinations thereof.

30. A process for forming a dielectric layer on a substrate which comprises chemical vapor depositing a monomeric or oligomeric dielectric precursor in a chemical vapor deposition apparatus, or a reaction product formed from the precursor in the apparatus, onto a substrate, to thus form a layer on a surface of a substrate; heating the layer at a sufficient time and temperature to dry the layer; and then exposing the layer to electron beam radiation, for a sufficient time, temperature, electron beam energy and electron beam dose modify the layer, wherein the layer is selected from the group consisting of Si—O—C materials, Si—C materials and combinations thereof.

31. A process for forming a dielectric layer on a substrate which comprises chemical vapor depositing a dielectric layer on a substrate and then exposing the chemical vapor deposited dielectric layer to electron beam radiation for a sufficient time, temperature, electron beam energy and electron beam dose to reduce the dielectric constant of the layer, wherein the layer is selected from the group consisting of Si—O—C materials, Si—C materials and combinations thereof.

* * * * *